(12) United States Patent
Choi et al.

(10) Patent No.: US 8,216,865 B2
(45) Date of Patent: Jul. 10, 2012

(54) DISPLAY DEVICE AND METHOD OF MANUFACTURING THE SAME

(75) Inventors: Young-Joo Choi, Gyeonggi-do (KR); Woo-Geun Lee, Gyeonggi-do (KR); Hye-Young Ryu, Seoul (KR); Ki-Won Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 12/772,836

(22) Filed: May 3, 2010

(65) Prior Publication Data
US 2011/0079776 A1    Apr. 7, 2011

(30) Foreign Application Priority Data
Oct. 7, 2009 (KR) .............................. 2009-0094911

(51) Int. Cl.
*H01L 21/00* (2006.01)
(52) U.S. Cl. .............. 438/30; 438/9; 438/149; 438/687; 438/706; 257/E21.006; 257/E21.218; 257/E21.229; 257/E21.411; 257/E21.414
(58) Field of Classification Search .................... 438/30, 438/9, 149, 608, 686, 687, 706; 257/249, 257/414, E21.006, 218, 229, 411
See application file for complete search history.

(56) References Cited

U.S. PATENT DOCUMENTS

| | | | | |
|---|---|---|---|---|
| 7,354,807 | B2* | 4/2008 | Yu et al. | 438/149 |
| 7,951,631 | B2* | 5/2011 | Jeon et al. | 430/5 |
| 2009/0184325 | A1* | 7/2009 | Park et al. | 257/72 |

* cited by examiner

*Primary Examiner* — David Nhu
(74) *Attorney, Agent, or Firm* — Innovation Counsel LLP

(57) ABSTRACT

A display device includes a gate pattern, a semiconductor pattern, a source pattern and a pixel electrode are provided. The gate pattern is formed on a base substrate and includes a gate line and a gate electrode. The semiconductor pattern is formed on the base substrate having the gate pattern and includes an oxide semiconductor. The source pattern is formed from a data metal layer and formed on the base substrate having the semiconductor pattern, and includes a data line, a source electrode and a drain electrode. The data metal layer includes a first copper alloy layer, and a lower surface of the data metal layer substantially coincides with an upper surface of the semiconductor pattern. The pixel electrode is formed on the base substrate having the source pattern and electrically connected to the drain electrode. Thus, manufacturing processes may be simplified, and reliability may be improved.

20 Claims, 8 Drawing Sheets

DISPLAY DEVICE AND METHOD OF MANUFACTURING THE SAME

This application claims priority to Korean Patent Applications No. 2009-094911, filed on Oct. 7, 2009, and all the benefits accruing therefrom under 35 U.S.C. §119, the contents of which are herein incorporated by reference in their entirety.

BACKGROUND OF THE INVENTION

1. Field of the Invention

The present invention relates to a display device and a method of manufacturing the display device. More particularly, example embodiments of the present invention relate to a display device manufactured by using an etchant composition for etching a copper alloy and an oxide semiconductor simultaneously in a photolithography process, and a method of manufacturing the display device.

2. Description of the Related Art

In general, a liquid crystal display (LCD) panel includes a display substrate, an opposite substrate facing the display substrate, and a liquid crystal layer interposed between the display substrate and the opposite substrate. The display substrate includes a switching element and a pixel electrode. A voltage is applied to the liquid crystal layer to control the transmittance of light through the liquid crystal layer so that an image is displayed.

The display substrate includes a plurality of thin-film layer patterns, which are formed by using a photolithography process to pattern a thin-film layer formed on an insulating substrate. For example, a photoresist pattern is formed on the thin-film layer, and then the thin-film layer is etched using the photoresist pattern as an etching mask, so that the thin-film layer patterns are formed. The thin-film layer may be etched through a wet-etching process or a dry-etching process according to properties of the thin-film layer. For example, when the thin-film layer includes a metal, the thin-film layer may be etched through a wet-etching process using an etchant solution. When the thin-film layer is an insulating layer including silicon oxide, etc., the thin-film layer may be etched through a dry-etching process using an etching gas.

In order to form a thin-film layer pattern, a mask having a design corresponding to the thin-film layer pattern is used. Recently, methods are in development which may allow thin-film layer patterns having different shapes to be formed by one mask. Using a single mask may simplify manufacturing processes, and may reduce the number of masks, which are expensive, required to form the thin-film layer patterns. When, however, thin-film layers are chemically different from each other, the thin-film layers need to be etched by individual etching processes, respectively. Thus, it is difficult to reduce numbers of processes or masks in such circumstances.

Copper has a high electric conductivity, and copper is an abundant natural resource. Copper may form a low-resistance line as compared to aluminum, chromium, etc. However, when a lower layer formed under a copper layer includes an oxygen atom, adhesion between the copper layer and the lower layer is reduced, so that employing a copper layer can be difficult in practice.

BRIEF SUMMARY OF THE INVENTION

In one aspect the present invention provides a display device having improved productivity and reliability.

In another aspect, the present invention also provides a method of manufacturing the above-mentioned display device.

A display device includes a gate pattern, a semiconductor pattern, a source pattern and a pixel electrode are provided. The gate pattern is formed on a base substrate and includes a gate line and a gate electrode. The semiconductor pattern is formed on the base substrate having the gate pattern and includes an oxide semiconductor. The source pattern is formed from a data metal layer and formed on the base substrate having the semiconductor pattern, and includes a data line, a source electrode and a drain electrode. The data metal layer includes a first copper alloy layer, and a lower surface of the data metal layer substantially coincides with an upper surface of the semiconductor pattern. The pixel electrode is formed on the base substrate having the source pattern and electrically connected to the drain electrode.

In another aspect, a gate pattern is formed on a base substrate. The gate pattern includes a gate line and a gate electrode. A semiconductor pattern and a source pattern including a data line, a source electrode and a drain electrode are formed by patterning both a data metal layer and an oxide semiconductor layer, which are formed on the base substrate having the gate pattern, the data metal layer including a first copper alloy layer, the oxide semiconductor layer including the oxide semiconductor. The pixel electrode electrically connected to the drain electrode is formed on the base substrate having the source pattern.

The first copper alloy layer may include copper and manganese.

The data metal layer may further include a copper layer formed on the first copper alloy layer.

The data metal layer may further include a copper layer formed on the first copper alloy layer and a second copper alloy layer formed on the copper layer.

The etchant composition includes about 0.1% to about 50% by weight of a persulfate, about 0.01% to about 5% by weight of an azole compound, about 0.05% to about 0.25% by weight of a fluoride compound and about 45% to about 99.84% of a solvent. More typically, the etchant composition includes about 0.1% to about 0.2% by weight of a fluoride compound.

An etchant composition capable of etching both of a copper-manganese layer and an oxide semiconductor layer is used. Thus, manufacturing processes may be simplified. Furthermore, the etchant composition does not form an undercut of an oxide semiconductor layer. Thus, reliabilities of a thin-film transistor and a display device may be improved.

BRIEF DESCRIPTION OF THE DRAWINGS

The above and other features and advantages of the present invention will become more apparent in the description of exemplary embodiments thereof with reference to the accompanying drawings, in which.

DETAILED DESCRIPTION OF THE INVENTION

Figure 1:
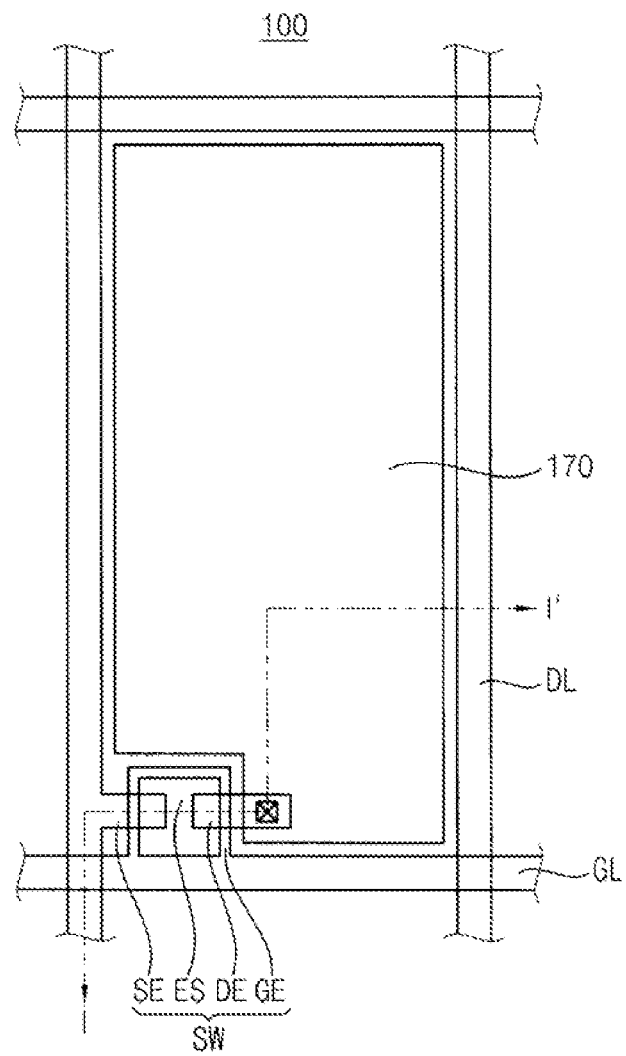
FIG. 1 is a plan view illustrating a display device according to an example embodiment.

The present invention is described more fully hereinafter with reference to the accompanying drawings, in which exemplary embodiments are shown. The present invention may, however, be embodied in many different forms and should not be construed as limited to the exemplary embodiments set fourth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer, or intervening elements or layers may be present. In contrast, when an element is referred to as being "directly on" or "directly connected to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s), as illustrated in the figures. It will be understood that the spatially relative terms are intended to encompass different orientations of the apparatus in use or operation in addition to the orientation depicted in the figures. For example, if the apparatus in the figures is turned over, elements described as "lower" with respect to other elements or features would then be oriented "upper" to those other elements or features. Thus, the exemplary term "lower" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross sectional illustrations that are schematic illustrations of idealized example embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non implanted region. Likewise, a buried region formed by implantation may result in some implantation in the region between the buried region and the surface through which the implantation takes place. Thus, the regions illustrated in the figures are schematic in nature and their shapes are not intended to illustrate the precise actual shape of a region of an apparatus and are not intended to limit the scope of the present invention.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the exemplary embodiments and does not pose a limitation on the scope of the invention unless otherwise claimed. No language in the specification should be construed as indicating any non-claimed element as essential to the practice of the invention as used herein.

Hereinafter, the embodiments will be explained in detail with reference to the accompanying drawings.

Etchant Composition

Examples of an etchant composition for etching a copper layer are described by Korea Patent Application 10-2007-0104166 (Published Number 10-2008-0084539) assigned to Samsung Electronics and Dongjin Semichem, incorporated herein by reference in its entirety. The etchant composition described in that application includes about 0.1% to about 50% by weight of ammonium persulfate, about 0.01% to about 5% by weight of an azole compound, about 0.01% to about 10% by weight of a fluoride compound and a remainder of a solvent. The etchant composition described in that application can etch a copper layer or a copper/titanium double layer, however, the etchant composition described in that application cannot etch both a copper alloy layer and an oxide semiconductor layer simultaneously, in the same process.

An etchant composition for etching both a copper alloy layer and an oxide semiconductor layer at the same time in the same process according to an example embodiment includes about 0.1% to about 50% by weight of a persulfate, about 0.01% to about 5% by weight of an azole compound, about 0.05% to about 0.25% by weight of a fluoride compound and about 45% to about 99.84% of a solvent.

The persulfate may be a main component of the etchant composition for etching a copper alloy layer. Examples of the persulfate may include, for example, ammonium persulfate, potassium persulfate, sodium persulfate, oxone, and the like. These persulfates can be used alone or in a combination in the etchant composition. When the content of the persulfate is less than about 0.1% by weight, a copper alloy layer is not sufficiently etched. When the content of the persulfate is more than about 50% by weight, a copper alloy layer is excessively etched. Thus, the content of the persulfate may be about 0.1% to about 50% by weight, and more typically about 1% to about 10% by weight.

The azole compound of the etchant composition may reduce cut dimension (CD) loss that may be caused due to over-etching of the copper alloy layer by the persulfate. Examples of the azole compound may include benzotriazole, aminotetrazole, imidazole, pyrazole, etc. These can be used alone or in a combination in the etchant composition. When the content of the azole compound is less than about 0.01% by weight, over-etching of the copper alloy layer is just barely controlled. On the other hand, when the content of the azole compound is more than about 5% by weight, an etching ratio of the copper alloy layer is excessively reduced. Therefore, the content of the azole compound may be about 0.01% to about 5% by weight, and more typically about 0.1% to about 1% by weight.

The fluoride compound of the etchant composition may increase an etching ratio of the copper alloy layer, and may be a main component for etching the oxide semiconductor layer. Examples of the fluoride compound may include, for example, hydrofluoric acid, ammonium fluoride, ammonium bifluoride, potassium fluoride, sodium fluoride, etc. These can be used alone or in a combination in the etchant composition. When the content of the fluoride compound is less than about 0.05% by weight, the oxide semiconductor layer is just barely etched. On the other hand, when the content of the fluoride compound is more than about 0.25% by weight, the oxide semiconductor layer is excessively etched thereby causing the oxide semiconductor layers to separate from the substrate. Therefore, the content of the fluoride compound may be about 0.05% to about 0.25% by weight, and more typically about 0.1% to about 0.2% by weight.

Examples of the solvent in the etchant composition may include, for example, distilled water. The content of the solvent may be about 45% to about 99.84% by weight.

The etchant composition may further include an additive. The additive may include a first compound including nitric acid and/or salts thereof, a second compound including sulfuric acid and/or salts thereof, a third compound including phosphoric acid and/or salts thereof, or a fourth compound including acetic acid and/or salts thereof The content of the additive may be about 0.01 parts by weight to about 40 parts by weight, when the weight of the etchant composition including the persulfate, the azole compound, the fluoride compound and the solvent is defined as 100 parts. When the content of the additive is less than about 0.01 parts by weight, the additive just barely improves the characteristics of the etchant composition. On the other hand, when the content of the additive is more than about 40 parts by weight, etching reliability to the copper alloy layer and the oxide semiconductor layer may be deteriorated.

The first compound that may be used for an additive generates a nitrate ion ($NO_3^-$) in the etchant composition. Examples of the first compound may include nitric acid, iron nitrate ($Fe(NO_3)_3$), potassium nitrate, ammonium nitrate, lithium nitrate, and the like. The content of the first compound may be about 0.01 parts to about 10 parts by weight, when the weight of the etchant composition including the persulfate, the azole compound, the fluoride compound and the solvent is defined as 100 parts.

The second compound that may be used for an additive generates a sulfate ion ($SO_4^{2-}$) or a hydrogen sulfate ion ($HSO_4^-$) in the etchant composition. Examples of the second compound may include sulfuric acid ($H2SO4$), potassium sulfate ($K_2SO_4$), ammonium hydrogen sulfate ($NH_4HSO_4$), potassium hydrogen sulfate ($KHSO_4$), and the like. The content of the second compound may be about 0.01 parts to about 10 parts by weight, when the weight of the etchant composition including the persulfate, the azole compound, the fluoride compound and the solvent is defined as 100 parts.

The third compound that may be used for an additive generates a phosphate ion ($PO_4^{3-}$), a hydrogen phosphate ion ($HPO_4^{2-}$) or a dihydrogen phosphate ion ($H_2PO_4^-$) in the etchant composition. Examples of the third compound may include phosphoric acid, ammonium phosphate (($NH_4)_3PO_4$), ammonium hydrogen phosphate (($NH_4)_2HPO_4$), ammonium dihydrogen phosphate ($NH_4H_2PO_4$), potassium phosphate ($K_3PO_4$), potassium hydrogen phosphate ($K_2HPO_4$), potassium dihydrogen phosphate ($KH_2PO_4$), sodium phosphate ($Na_3PO_4$), sodium hydrogen phosphate ($Na_2HPO_4$), sodium dihydrogen phosphate ($NaH_2PO_4$), and the like. The content of the third compound may be about 0.01 parts to about 10 parts by weight, when the weight of the etchant composition including the persulfate, the azole compound, the fluoride compound and the solvent is defined as 100 parts.

The fourth compound that may be used for an additive generates an acetate ion ($CH_3COO^-$) in the etchant composition. Examples of the fourth compound may include acetic acid, potassium acetate, ammonium acetate, sodium acetate, iminodiacetic acid ($HN(CH_2COOH)_2$), and the like. The content of the fourth compound may be about 0.01 parts to about 10 parts by weight, when the weight of the etchant composition including the persulfate, the azole compound, the fluoride compound and the solvent is defined as 100 parts.

The etchant composition may further include a sulfonic compound or a chelate agent, which is added to the persulfate, the azole compound and the fluoride compound.

The sulfonic compound may inhibit decomposition of the persulfate. Examples of the sulfonic compound may include benzenesulfonic acid, para-toluenesulfonic acid, methanesulfonic acid, amidosulfonic acid and the like. The content of the sulfonic compound may be about 0.001 parts to about 10 parts by weight, when the weight of the etchant composition including the persulfate, the azole compound, the fluoride compound and the solvent may be defined as 100 parts.

The chelate agent is combined with a copper ion generated while the etchant composition etches a copper alloy layer, to prevent the copper ion from affecting an etching ratio of the etchant composition. Examples of the chelate agent may include a series of phosphonic compounds, a series of sulfonic compounds, a series of acetate compounds, etc. The content of the chelate agent may be about 0.0001 parts to about 5 parts by weight, when the weight of the etchant composition including the persulfate, the azole compound, the fluoride compound and the solvent is defined as 100 parts.

Display Device

FIG. 1 is a plan view illustrating a display device according to an example embodiment.

Figure 2:
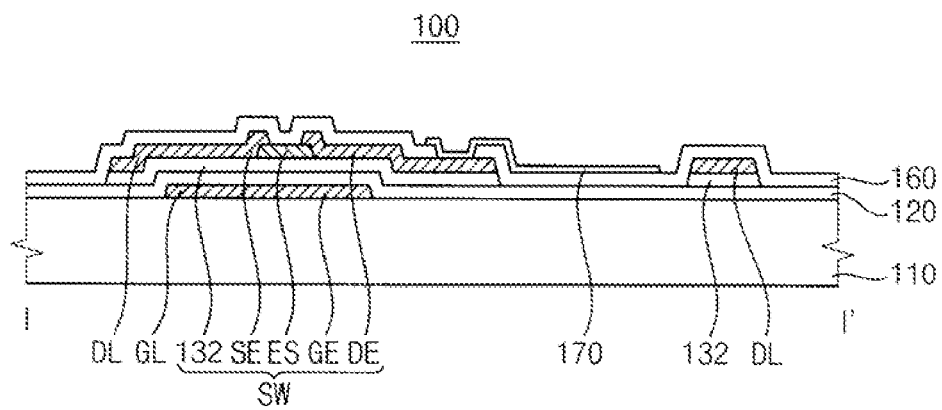
FIG. 2 is a cross-sectional view taken along the line I-I' of FIG. 1.

FIG. 2 is a cross-sectional view taken along the line I-I' of FIG. 1.

Referring to FIGS. 1 and 2, a display device 100 includes a gate line GL, a data line DL crossing the gate line GL, a thin-film transistor SW and a pixel electrode 170. The display device 100 may further include a gate insulating layer 120 and a passivation layer 160.

The thin-film transistor SW is electrically connected to the gate line GL and the data line DL. The thin-film transistor SW includes a gate electrode GE connected to the gate line GL, a source electrode SE connected to the data line DL, a drain electrode DE spaced apart from the source electrode SE, a semiconductor pattern 132 and an etching-stopper ES.

A gate pattern that includes the gate electrode GE and the gate line GL is formed on a base substrate 110. The gate insulating layer 120 is formed on the base substrate 110 having the gate pattern.

The semiconductor pattern 132 is formed on the base substrate 110 having the gate insulating layer 120, and is under a source pattern. The source pattern includes the source electrode SE, the drain electrode DE and the data line DL. The semiconductor pattern 132 includes an oxide semiconductor. The etching-stopper ES is formed on a region of semiconductor pattern 132 where the gate electrode GE is formed, so that etching-stopper ES overlaps with a portion of the gate electrode GE. The source electrode SE and the drain electrode DE are formed on the base substrate 110 having the etching-stopper ES so that ends of the source electrode SE and the drain electrode DE are overlapped with ends of the etching-stopper ES. The data line DL is formed on the base substrate 110 having the semiconductor pattern 132.

A described in more detail below, the semiconductor pattern 132 is formed from an oxide semiconductor layer, and the source pattern is formed from a data metal layer, and the semiconductor pattern 132 and the source pattern are patterned in the same process using the above-described etchant composition. Thus, an upper surface of the semiconductor pattern substantially coincides with a lower surface of the source pattern. Preferably, an undercut of the semiconductor pattern may be less than about 20 nm, the undercut of the semiconductor pattern defined as a length of a lower portion of the semiconductor pattern protruding from a lower surface of the semiconductor pattern in a lateral direction.

The passivation layer 160 is formed on the base substrate 110 having the source pattern. The pixel electrode 170 is formed on the base substrate 110 having the passivation layer 160, and is electrically connected to the drain electrode DE so that the pixel electrode 170 is electrically connected to the thin-film transistor SW.

Method of Manufacturing a Display Device

Figure 3:
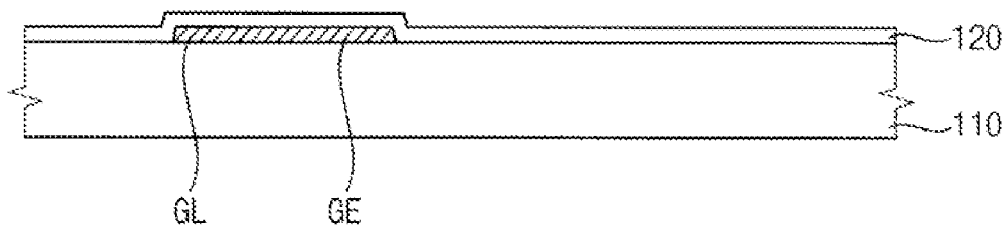
FIGS. 3, 4 and 5 are cross-sectional views illustrating a method of manufacturing the display device illustrated in FIG. 2.
Figure 4:
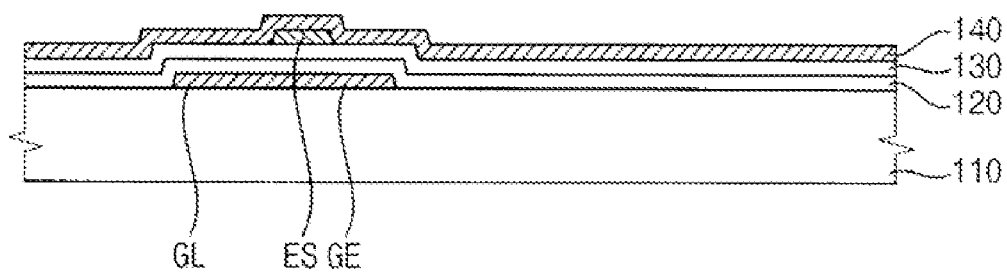
Figure 5:
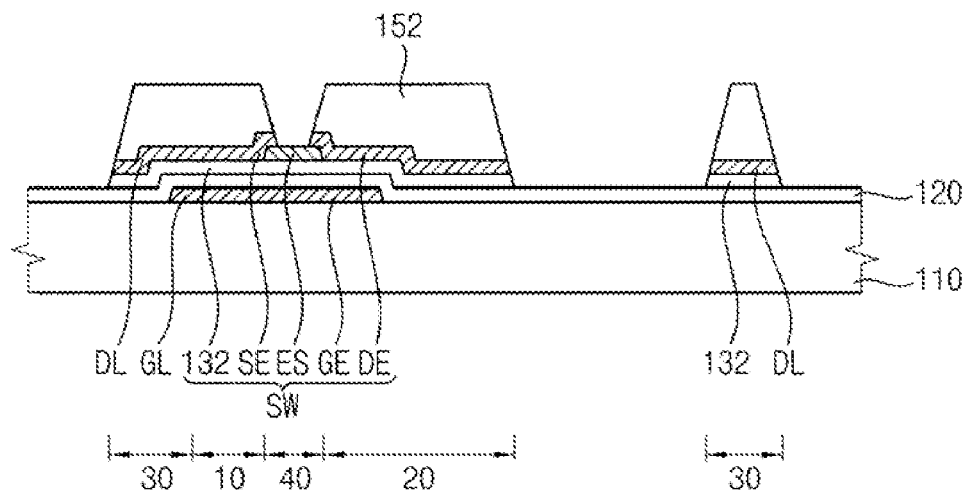

FIGS. 3, 4 and 5 are cross-sectional views illustrating a method of manufacturing the display device illustrated in FIG. 2.

Referring to FIG. 3, a gate pattern that includes the gate line GL and the gate electrode GE is formed on the base substrate 110, and the gate insulating layer 120 is formed on the base substrate 110 having the gate pattern.

To form the gate pattern, for example, a gate metal layer is formed on the base substrate 110, and then the gate metal layer is patterned through a photolithography process. The gate metal layer may include, for example, copper.

Referring to FIG. 4, an oxide semiconductor layer 130, the etching-stopper ES and a data metal layer 140 are sequentially formed on the base substrate 110 having the gate insulating layer.

The oxide semiconductor layer 130 includes X-indium zinc oxide (XIZO). X may represent Sn, Ga, Al, Be, Mg, Ca, Sr, Ba, Ra, Tl, Sc, Y, La, Ac, Ti, Zr, Hf or Rf. Particular examples of XIZO may include $Ga_2O_3$—$In_2O_3$—$ZnO$ (GIZO), $HfO_2$—$In_2O_3$—$ZnO$ and the like. The thickness of the semiconductor layer 130 may be about 300 Å to about 500 Å.

The etching-stopper ES is formed on the base substrate 110 having the oxide semiconductor layer 130. To form the etching-stopper ES, for example, an insulating layer (not shown) is formed on the base substrate 110 having the oxide semiconductor layer 130, and then the insulating layer is patterned through a photolithography process. The insulating layer may include silicon oxide, silicon nitride, and the like. The insulating layer is partially removed, so that a portion of the insulating layer that is disposed on a region of the oxide semiconductor layer 130 remains to form the etching-stopper ES. Therefore, the etching-stopper ES is formed on the region oxide semiconductor layer 130 where the gate electrode GE is overlapped with the oxide semiconductor layer 130.

The data metal layer 140 is formed on the base substrate 110 having the etching-stopper ES. The data metal layer 140 includes a copper alloy, for example, a copper-manganese alloy. The data metal layer 140 may be a substantially single layer including the copper alloy. The data metal layer 140 has strong interface adhesion to the oxide semiconductor layer 130. Thus, the data metal layer 140 may be stably formed on the oxide semiconductor layer 130. The thickness of the data metal layer 140 may be about 2,000 Å to about 4,000 Å.

Referring to FIG. 5, a photoresist pattern 152 is formed on the base substrate 110 having the data metal layer 140. The photoresist pattern 152 is formed on a source region 10, a drain region 20 and a source line region 30, so that the data metal layer 140 formed on a channel region 40 is exposed.

Thereafter, the data metal layer 140 and the oxide semiconductor layer 130 are etched in the same process, using the photoresist pattern 152 as an etching mask and using an etchant composition.

The etchant composition used to etch both the data metal layer 140 and the oxide semiconductor layer 130 through photoresist pattern 152 is substantially the same as the above-described etchant composition. Thus, redundant explanation of the etchant composition will be omitted.

The etchant composition etches both the data metal layer 140 and the oxide semiconductor layer 130. Thus, the source electrode SE and the drain electrode DE are formed on the source region 10 and the drain region 20, respectively, and the data line DL is formed on the source line region 30. The semiconductor pattern 132 is formed under the source pattern including the source electrode SE, the drain electrode DE and the data line DL. The data metal layer 140 on the channel region 40 is exposed through the photoresist pattern 152 so that the data metal layer 140 on the channel region 40 is removed by the etchant composition. The semiconductor pattern 132 formed on the channel region 40 is protected by the etching-stopper ES. Thus, the semiconductor pattern 132 formed on the channel region 40 is not removed by the etchant composition, and may remain.

The photoresist pattern 152 is then removed by a strip composition. As a result, the thin-film transistor SW including the gate electrode GE, the semiconductor pattern 132, the etching-stopper ES, the source electrode SE and the drain electrode DE are formed on the base substrate 110.

Thereafter, the passivation layer 160 (FIG. 2) is formed on the base substrate 110 having the source pattern. The passivation layer 160 is patterned to form a contact hole exposing an end of the drain electrode DE. A transparent electrode layer is formed on the base substrate 110 having the passivation layer 160 having the contact hole, and is patterned to form the pixel electrode 170 (FIG. 2) electrically connected to the drain electrode DE through the contact hole.

As a result, the display device 100 according to an example embodiment is formed.

According to the example embodiment, the data metal layer 140 including a copper alloy and the oxide semiconductor layer 130 may be etched in the same process, using the etchant composition that can etch both a copper alloy and an oxide semiconductor, and using a single mask. Use of the single mask with the etchant composition to etch both the data metal layer 140 including a copper alloy and the oxide semiconductor layer 130 in the same, single process can simplify the manufacturing processes for a display device. More than one mask is not required to etch both layers.

Furthermore, because the etchant composition barely penetrates into a lower layer under the oxide semiconductor layer 130, an undercut is not formed under the oxide semiconductor layer 130. Therefore, separation of the semiconductor pattern 132 from the lower layer (a problem sometimes referred to as "lift-off") may be prevented, and manufacturing reliabilities of the thin-film transistor SW and the display device 100 may be improved.

Display Device

Figure 6:
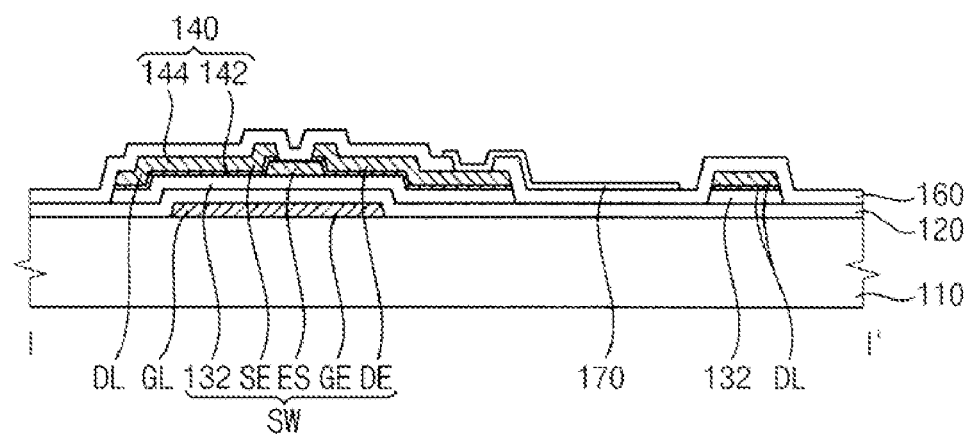
FIG. 6 is a cross-sectional view illustrating a display device according to another example embodiment.

FIG. 6 is a cross-sectional view illustrating a display device according to another example embodiment.

A display device 102 illustrated in FIG. 6 is substantially the same as the display device 100 illustrated in FIGS. 1 and 2, except for the structure of the source pattern. Thus, redundant explanation will be omitted.

Referring to FIG. 6, the source pattern including a data line DL, a source electrode SE and a drain electrode DE has a double-layered structure that includes a first copper alloy layer 142 and a copper layer 144. For example, a data metal layer 140 including the first copper alloy layer 142 and the copper layer 144 is formed and patterned through a photolithography process to form the source pattern.

The copper layer 144 of the data metal layer 140 substantially functions as a signal line. The first copper alloy layer 142 is interposed between the oxide semiconductor layer 130 and the copper layer 144 to improve adhesion of the oxide semiconductor layer 130 and the copper layer 144. The thickness of the first copper alloy layer 142 may be about 300 Å to about 500 Å. The thickness of the copper layer 144 may be about 2,000 Å to about 4,000 Å.

The data metal layer 140 is etched together with an oxide semiconductor layer 130 (illustrated in FIG. 4) by the etchant composition in the same process, to form the source pattern and the semiconductor pattern 132.

Method of Manufacturing a Display Device

A method of manufacturing the display device 102 illustrated in FIG. 6 is substantially the same as the method of manufacturing the display device 100 illustrated in FIGS. 3 to 5, except that the copper layer 144 is formed after the first copper alloy layer 142 is formed. Thus, redundant explanation will be omitted.

Both of the first copper alloy layer 142 and the copper layer 144, together with oxide semiconductor layer 130, are etched by an etchant composition in the same process, as described above. The etchant composition used in the etching process is substantially the same as the etchant composition described with reference to FIG. 5.

Display Device

Figure 7:
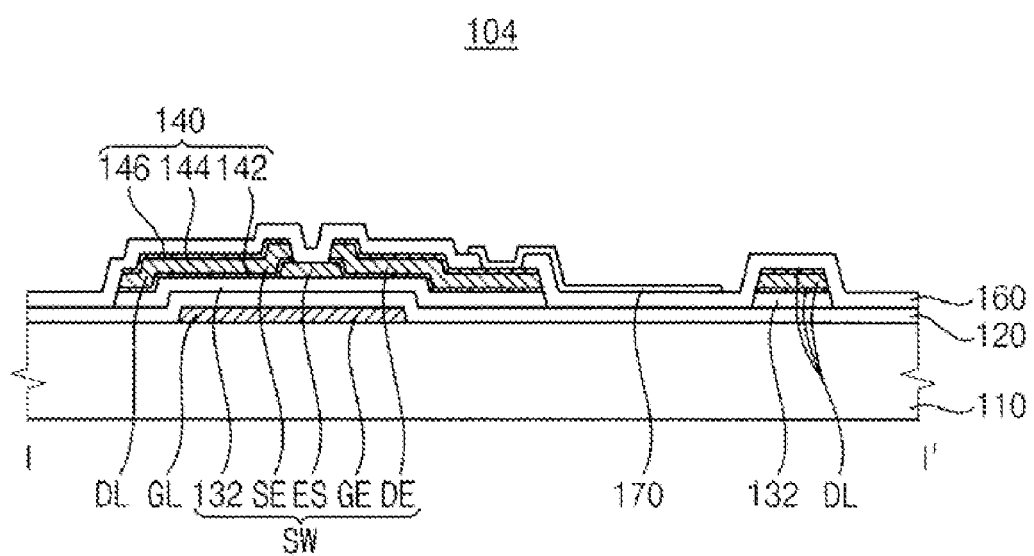
FIG. 7 is a cross-sectional view illustrating a display device according to still another example embodiment.

FIG. 7 is a cross-sectional view illustrating a display device according to still another example embodiment.

A display device 104 illustrated in FIG. 7 is substantially the same as the display device 100 illustrated in FIGS. 1 and 2, except for the structure of the source pattern. Thus, redundant explanation will be omitted.

Referring to FIG. 7, the source pattern including a data line DL, a source electrode SE and a drain electrode DE has a triple-layered structure that includes a first copper alloy layer 142, a copper layer 144 and a second copper alloy layer 146. The second copper alloy layer 146 may include the same material as the first copper alloy layer 142. The second copper alloy layer 146 is formed on the copper layer 144 to prevent the copper layer 144 from being damaged by an etchant composition, an etching gas, etc., in subsequent processes. The thickness of the second copper alloy layer 146 may be about 300 Å to about 500 Å.

For example, a data metal layer 140 that includes the first copper alloy layer 142, the copper layer 144 and the second data metal layer 146 is formed and patterned through a photolithography to form the source pattern. The data metal layer 140 is etched with an oxide semiconductor layer 130 (illustrated in FIG. 4) by the etchant composition in the same process to form the source pattern and the semiconductor pattern 132.

Method of Manufacturing a Display Device

A method of manufacturing the display device 104 illustrated in FIG. 7 is a substantially the same as the method of manufacturing the display device 102 illustrated in FIG. 6, except that the second copper alloy layer 146 is formed after the copper layer 144 is formed. Thus, redundant explanation will be omitted.

The first copper alloy layer 142, the copper layer 144 and the second copper alloy layer 146, together with the oxide semiconductor layer 130, are etched by an etchant composition in the same process. The etchant composition is substantially the same as the etchant composition described with reference to FIG. 5.

Display Device

Figure 8:
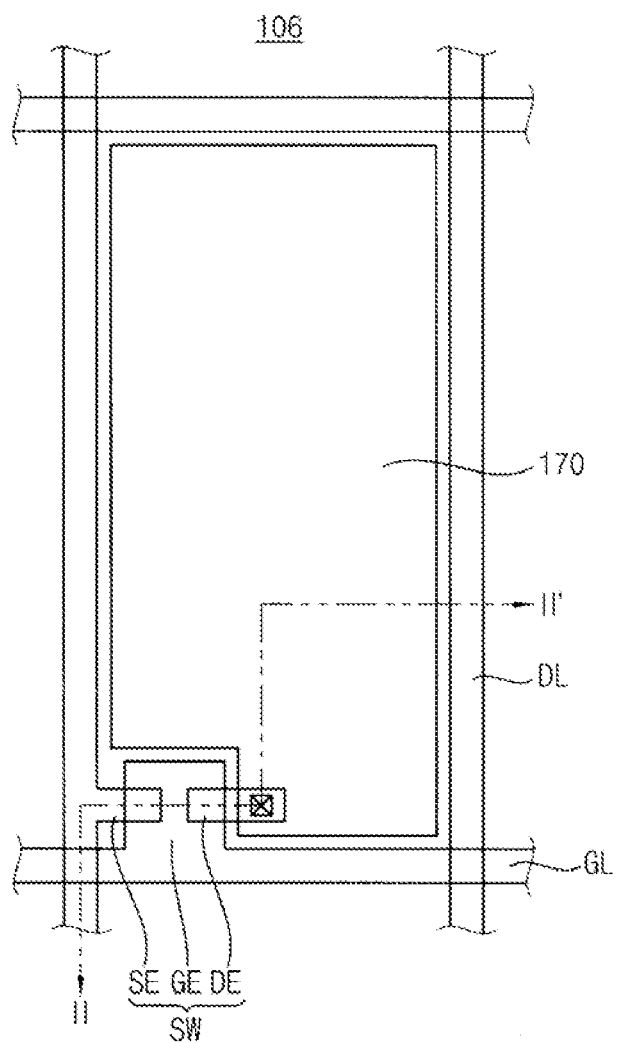
FIG. 8 is a plan view illustrating a display device according to still another example embodiment.

FIG. 8 is a plan view illustrating a display device according to still another example embodiment.

Figure 9:
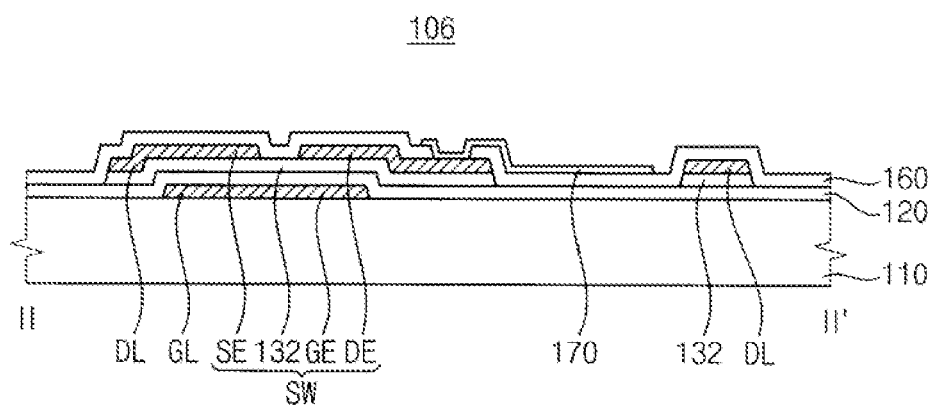
FIG. 9 is a cross-sectional view taken along the line II-II' of FIG. 8.

FIG. 9 is a cross-sectional view taken along the line II-II' of FIG. 8.

Referring to FIGS. 8 and 9, a display device 104 includes a gate line GL, a data line DL crossing the gate line GL, a thin-film transistor SW and a pixel electrode 170. The display device 106 may further include a gate insulating layer 120 and a passivation layer 160. The display device 106 illustrated in FIGS. 8 and 9 is substantially the same as the display device 100 illustrated in FIGS. 1 and 2. Thus, redundant explanation will be omitted.

Hereinafter, a method of manufacturing the display device 106 illustrated in FIGS. 8 and 9 will be described with reference to FIGS. 10, 11 and 12.

Method of Manufacturing a Display Device

Figure 10:
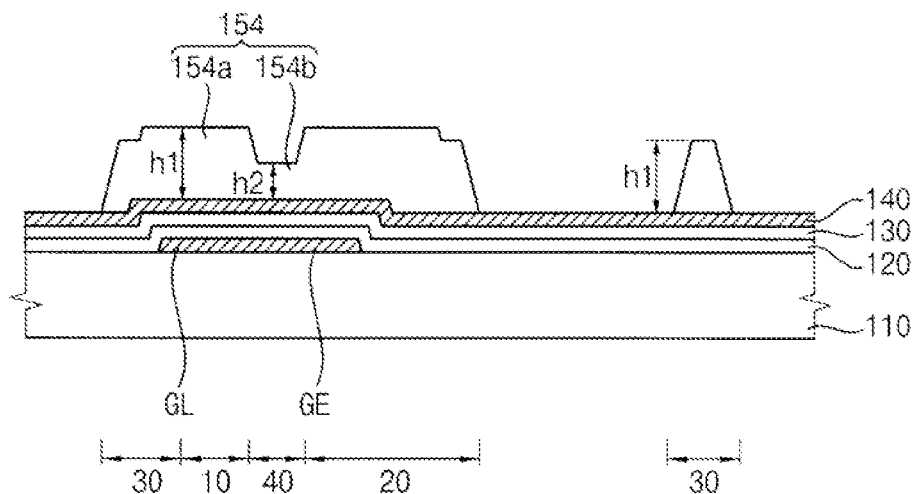
FIGS. 10, 11 and 12 are cross-sectional views illustrating a method of manufacturing the display device illustrated in FIG. 9.
Figure 11:
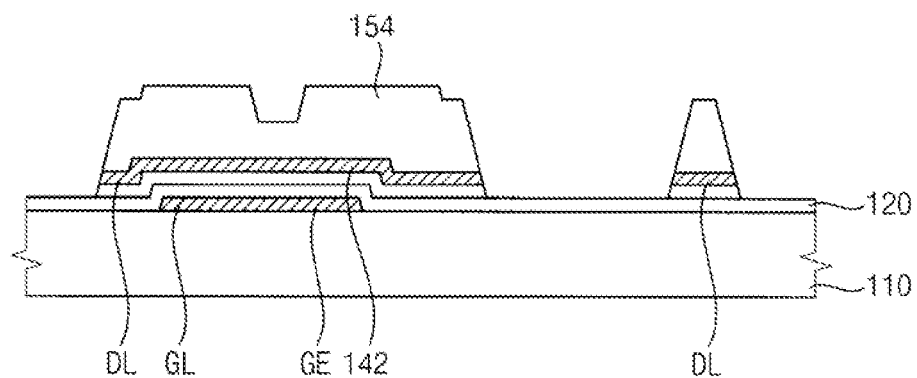
Figures 12, 13:
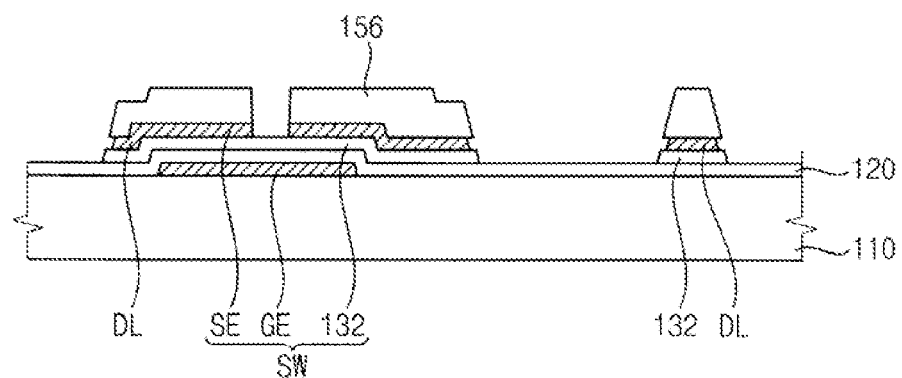
FIG. 13 is a schematic cross-sectional view illustrating etched surfaces of an oxide semiconductor layer, a copper alloy layer and a copper layer that are 30%-overetched by the etchant compositions according to Example 1, Example 2, Comparative Example 2, Comparative Example 3 and Comparative Example 4.

FIGS. 10, 11 and 12 are cross-sectional views illustrating a method of manufacturing the display device illustrated in FIGS. 8 and 9.

Referring to FIG. 10, a gate pattern that includes the gate line GL and the gate electrode GE is formed on the base substrate 110, and a gate insulating layer 120, an oxide semiconductor layer 130 and a data metal layer 140 are sequentially formed on the base substrate 110 having the gate pattern. The data metal layer 140 may have a single-layered structure including a copper alloy layer, or a double-layered or triple-layered structure including a copper alloy layer and a copper layer.

A photoresist pattern 154 is formed on the base substrate 110 having the data metal layer 140. The photoresist pattern 154 is formed on a source region 10, a drain region 20, a source line region 30 and a channel region 40. The photoresist pattern 154 includes a first portion 154a and a second portion 154b. The first portion 154a is formed on the source region 10, the drain region 20 and the source line region 30, and has a first thickness h1. The second portion 154b is formed on the channel region 40 and has a second thickness h2. The first thickness h1 is greater that the second thickness h2. For example, the second thickness h2 may be a half of the first thickness h1.

Referring to FIG. 11, the data metal layer 140 and the oxide semiconductor layer 130 are etched in the same process using the photoresist pattern 154 as an etching mask and using an etchant composition.

The etchant composition is substantially the same as the etchant composition described with reference to FIG. 5. Thus, redundant explanation will be omitted. Etching processes for the data metal layer 140 and the oxide semiconductor layer 130 may be simplified by using the etchant composition.

As a result, the data line DL, an electrode pattern 142 connected to the data line DL, and the semiconductor pattern 132 formed under the data line DL and the electrode pattern 142 are formed on the base substrate 110. The data line DL is formed on the source line region 30. The electrode pattern 142 is formed on the source region 10, the drain region 20 and the channel region 40.

Referring to FIG. 12, the second portion 154b of the photoresist pattern 154 is removed to form a remaining photoresist pattern 156. When the second portion 154b of the photoresist pattern 154 is removed, a portion of the first portion 154a of the photoresist pattern 154 is removed so that a thickness of the first portion 154a is reduced by the amount of the second thickness h2. As a result, the remaining photoresist pattern 156 is formed on the source region 10, the drain region 20 and the source line region 30. The portion of the electrode pattern 142 formed on the channel region 40 is exposed.

Thereafter, the portion of the electrode pattern 142 formed on the channel region 40 is removed by using the remaining photoresist pattern 156 as an etching mask. A copper etchant composition used for removing the electrode pattern 142 on the channel region 40 etches the data metal layer 140, however, the copper etchant composition does not etch the semiconductor pattern 132. For example, the copper etchant composition may include a persulfate, an azole compound and a solvent without a fluoride compound. When the copper etchant composition is applied, outer portions, or edges, of the electrode pattern 142 and the data line DL may be partially etched. Thus, boundaries of the electrode pattern 142 and the data line DL may be recessed as compared to a boundary of the semiconductor pattern 132. Particularly, the electrode pattern 142 and the data line DL are partially removed by the copper etchant composition so that the semiconductor pattern 132 has a portion protruding from the electrode pattern 142 and the data line DL.

The portion of the electrode pattern 142 formed on the channel region 40 is removed so that the source electrode SE connected to the data line DL and the drain electrode DE spaced apart from the source electrode SE are formed. Thus, the thin-film transistor SW including the gate electrode GE, the semiconductor pattern 132, the source electrode SE and the drain electrode DE is formed.

Thereafter, a passivation layer 160 (FIG. 9) is formed on the base substrate 110 having the source pattern, and a pixel electrode 170 (FIG. 9) electrically connected to the drain electrode DE is formed on the base substrate 110 having the passivation layer 160.

As a result, the display device 106 according to still another example embodiment may be manufactured.

According to the example embodiment, the number of masks required for manufacturing a display device may be reduced because the data metal layer 140 and the oxide semiconductor layer 130 are patterned by using one mask. Furthermore, the data metal layer 140 including a copper alloy layer and the oxide semiconductor layer 130 may be etched in the same process using the etchant composition that can etch both a copper alloy and an oxide semiconductor. Thus, manufacturing processes for a thin-film transistor and a display device may be simplified.

Manufacturing an Etchant Composition

Figure 14:
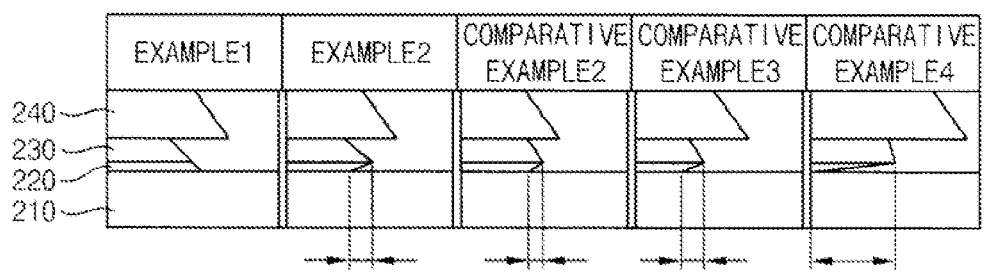
FIG. 14 is a schematic cross-sectional view illustrating etched surfaces of an oxide semiconductor layer, a copper alloy layer and a copper layer that are 60%-overetched by the etchant compositions according to Example 1, Example 2, Comparative Example 2, Comparative Example 3 and Comparative Example 4.
Figure 15:
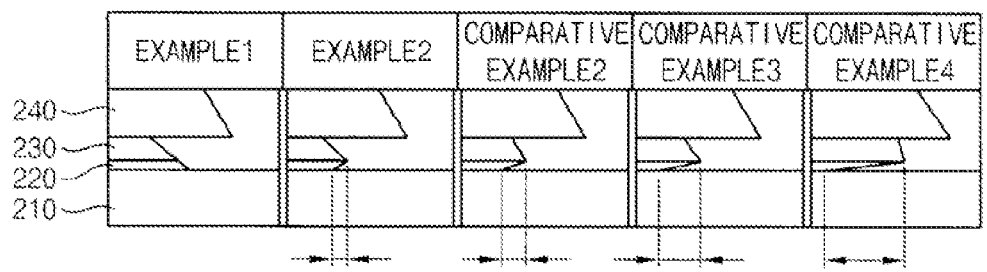
FIG. 15 is a schematic cross-sectional view illustrating etched surfaces of an oxide semiconductor layer, a copper alloy layer and a copper layer that are 90%-overetched by the etchant compositions according to Example 1, Example 2, Comparative Example 2, Comparative Example 3 and Comparative Example 4.

Hereinafter, the effect of an etchant composition on a metal layer 230 that includes a copper alloy layer and a copper layer will be explained with reference to drawings illustrating an etched surface of the metal layer. In the etchant compositions used to etch the metal layer 230, the content of a fluoride compound is varied, so the tests illustrate how the etching of the metal layer 230 depends on the fluoride composition. In FIGS. 14, 15 and 16, the reference numeral "240" represents a photoresist pattern used as an etching mask for the metal layer 230.

Firstly, the etchant compositions used for the test, which are labeled Example 1, Example 2, Comparative Example 1, Comparative Example 2, Comparative Example 3 and Comparative Example 4, were prepared as indicated in Table 1 below. In Table 1, the content of each component in the etchant compositions is represented by % by weight.

TABLE 1

|  | Example 1 | Example 2 | Comparative Example 1 | Comparative Example 2 | Comparative Example 3 | Comparative Example 4 |
|---|---|---|---|---|---|---|
| Ammonium Persulfate | 5 | 5 | 5 | 5 | 5 | 5 |
| Azole Compound | 0.5 | 0.5 | 0.5 | 0.5 | 0.5 | 0.5 |
| Fluoride Compound | 0.1 | 0.2 | — | 0.3 | 0.4 | 0.5 |

TABLE 1-continued

|  | Example 1 | Example 2 | Comparative Example 1 | Comparative Example 2 | Comparative Example 3 | Comparative Example 4 |
|---|---|---|---|---|---|---|
| First Compound | 0.2 | 0.2 | 0.2 | 0.2 | 0.2 | 0.2 |
| Second Compound | 1.0 | 1.0 | 1.0 | 1.0 | 1.0 | 1.0 |
| Third Compound | 1.0 | 1.0 | 1.0 | 1.0 | 1.0 | 1.0 |
| Sulfonic Compound | 0.2 | 0.2 | 0.2 | 0.2 | 0.2 | 0.2 |
| Chelate agent | 0.001 | 0.001 | 0.001 | 0.001 | 0.001 | 0.001 |
| Solvent | 91.999 | 91.899 | 92.099 | 91.799 | 91.699 | 91.599 |
| Summation | 100 | 100 | 100 | 100 | 100 | 100 |

In Table 1, the first compound includes nitric acid and/or salts thereof, the second compound includes sulfuric acid and/or salts thereof, and the third compound includes phosphoric acid and/or salts thereof.

The etchant composition according to Example 1 of the present invention includes about 5% by weight of ammonium persulfate, about 0.5% by weight of the azole compound, about 0.1% by weight of the fluoride compound, about 0.2% by weight of the first compound, about 0.1% by weight of the second compound, about 0.1% by weight of the third compound, about 0.2% by weight of the sulfonic compound, about 0.001% by weight of the chelate agent and about 91.999% by weight of the solvent.

The etchant composition according to Example 2 of the present invention is substantially the same as the etchant composition according to Example 1 except that Example 2 includes about 0.2% by weight of the fluoride compound.

The etchant composition according to Comparative Example 1 is substantially the same as the etchant composition according to Example 1 except that Comparative Example 1 does not including the fluoride compound. The etchant composition according to Comparative Example 2 is substantially the same as the etchant composition according to Example 1 except that Comparative Example 2 includes about 0.3% by weight of the fluoride compound. The etchant composition according to Comparative Example 3 is substantially the same as the etchant composition according to Example 1 except that Comparative Example 3 includes about 0.4% by weight of the fluoride compound. The etchant composition according to Comparative Example 4 is substantially the same as the etchant composition according to Example 1 except that Comparative Example 4 includes about 0.5% by weight of the fluoride compound.

The tests were performed on test substrates in which photoresist pattern 240 (FIGS. 13-15) was formed on a substrate 210 having an oxide semiconductor layer 220 that included hafnium-indium-zinc oxide (Hf—In—ZnO), and a metal layer 230 that included a copper-manganese alloy layer and a copper layer. In the tests, the oxide semiconductor layer 220 and the metal layer 230 were over-etched. Over-etching was accomplished by using the photoresist pattern 240 as an etching mask, and by extending the time that the etchant composition remained in contact with the test substrate past the time that the etching of metal layer 230 was completed, i.e., the etchant composition was allowed to remain in contact with the test substrate after metal layer 230 was etched to the edge of the photoresist pattern 240. The etching times were extended, in the three examples illustrated in FIGS. 13-15 by about 30% by time, about 60% by time and about 90% by time, respectively, that is, FIG. 13 illustrates a test substrate that is 30% over-etched, FIG. 14 illustrates a test substrate that is 60% over-etched, and FIG. 15 illustrates a test substrate that is 90% over-etched. Thereafter, the length of any undercut between the oxide semiconductor layer 220 and the substrate 210 was measured. The results obtained are represented in Table 2, Table 3 and Table 4, below.

TABLE 2

|  | Example 1 | Example 2 | Comparative Example 1 | Comparative Example 2 | Comparative Example 3 | Comparative Example 4 |
|---|---|---|---|---|---|---|
| Length of undercut | 0 nm | 5 nm | Semiconductor pattern was not formed. | 66 nm | 27 nm | 303 nm |

FIG. 13 is a schematic cross-sectional view illustrating etched surfaces of an oxide semiconductor layer 220, a copper alloy layer and a copper layer, collectively 230, that were 30%-overetched by the etchant compositions according to Example 1, Example 2, Comparative Example 2, Comparative Example 3 and Comparative Example 4.

Referring to Table 2 and FIG. 13, the results show that the lengths of the undercut were about 0 nm and about 5 nm, respectively, when the etchant compositions according to Example 1 and Example 2 were applied. When the etchant composition according to Comparative Example 1 was applied, the oxide semiconductor layer 220 was not etched, so a semiconductor pattern was not formed.

Furthermore, the results show that the lengths of the undercut were about 66 nm, about 27 nm and about 303 nm, respectively, when the etchant compositions according to Comparative Examples 2, 3 and 4 were applied. Therefore, Comparative Examples 2, 3 and 4, which include no less than about 0.3% by weight of the fluoride compound, form relatively longer undercuts of the oxide semiconductor layer as compared to Examples 1 and 2, so that the oxide semiconductor layer etched by etchant compositions of Comparative Examples 2, 3 and 4 is easily separated (lifted off) from the lower layer.

TABLE 3

|  | Example 1 | Example 2 | Comparative Example 1 | Comparative Example 2 | Comparative Example 3 | Comparative Example 4 |
|---|---|---|---|---|---|---|
| Length of undercut | 0 nm | 10 nm | Semiconductor pattern was not formed. | 93 nm | 107 nm | 551 nm |

FIG. 14 is a schematic cross-sectional view illustrating etched surfaces of an oxide semiconductor layer 220, a copper alloy layer and a copper layer, collectively 230, that were 60%-overetched by the etchant compositions according to Example 1, Example 2, Comparative Example 2, Comparative Example 3 and Comparative Example 4.

Referring to Table 3 and FIG. 14, the results show that the lengths of the undercut were about 0 nm and about 10 nm, respectively, when the etchant compositions according to Example 1 and Example 2 were applied. When the etchant composition according to Comparative Example 1 was applied, the oxide semiconductor layer 220 was not etched, so a semiconductor pattern was not formed.

Furthermore, the results show that the lengths of the undercut were about 93 nm, about 107 nm and about 551 nm, respectively, when the etchant compositions according to Comparative Examples 2, 3 and 4 were applied. Therefore, Comparative Examples 2, 3 and 4, which include no less than about 0.3% by weight of the fluoride compound, form relatively longer undercuts of the oxide semiconductor layer with compared to Examples 1 and 2, so that the oxide semiconductor layer etched by etchant compositions of Comparative Examples 2, 3 and 4 is easily separated (lifted off) from the lower layer.

TABLE 4

|  | Example 1 | Example 2 | Comparative Example 1 | Comparative Example 2 | Comparative Example 3 | Comparative Example 4 |
|---|---|---|---|---|---|---|
| Length of undercut | 0 nm | 15 nm | Semiconductor pattern was not formed. | 230 nm | 363 nm | 778 nm |

FIG. 15 is a schematic cross-sectional view illustrating etched surfaces of an oxide semiconductor layer 220, a copper alloy layer and a copper layer, collectively 230, that were 90%-overetched by the etchant compositions according to Example 1, Example 2, Comparative Example 2, Comparative Example 3 and Comparative Example 4.

Referring to Table 4 and FIG. 15, the results show that the lengths of the undercut were about 0 nm and about 15 nm, respectively, when the etchant compositions according to Example 1 and Example 2 were applied. When the etchant composition according to Comparative Example 1 was applied, the oxide semiconductor layer 220 was not etched, so a semiconductor pattern was not formed.

Furthermore, the results show that the lengths of the undercut were about 230 nm, about 363 nm and about 778 nm, respectively, when the etchant compositions according to Comparative Examples 2, 3 and 4 were applied. Therefore, Comparative Examples 2, 3 and 4, which include no less than about 0.3% by weight of the fluoride compound, form relatively longer undercuts of the oxide semiconductor layer as compared to Examples 1 and 2, so the oxide semiconductor layer etched by etchant compositions of Comparative Examples 2, 3 and 4 is easily separated (lifted off) from the lower layer.

Therefore, an etchant composition according to an example embodiment for etching both a copper-manganese layer and an oxide semiconductor layer includes about 0.05% to about 0.25% by weight of a fluoride compound, and more typically includes about 0.1% to about 0.2% by weight of a fluoride compound.

According to embodiments, an etchant composition capable of etching both of a copper-manganese layer and an oxide semiconductor layer is used. Thus, manufacturing processes may be simplified. Furthermore, the etchant composition does not form an undercut of an oxide semiconductor layer. Thus, reliabilities of a thin-film transistor and a display device may be improved.

Although the exemplary embodiments have been described, it is understood that the present invention should not be limited to these exemplary embodiments but various changes and modifications can be made by one ordinary skilled in the art within the spirit and scope of the disclosure as hereinafter claimed.

What is claimed is:
1. A display device comprising:
a gate pattern formed on a base substrate and including a gate line and a gate electrode;
a semiconductor pattern formed on the base substrate having the gate pattern and including an oxide semiconductor;
a source pattern formed from a data metal layer and formed on the base substrate having the semiconductor pattern and including a data line, a source electrode and a drain electrode,
wherein the source pattern includes a first copper alloy layer, an upper surface of the semiconductor pattern and a lower surface of the source pattern substantially coincide; and
a pixel electrode formed on the base substrate having the source pattern and electrically connected to the drain electrode.
2. The display device of claim 1, wherein the first copper alloy layer comprises copper and manganese.
3. The display device of claim 2, wherein the data metal layer further comprises a copper layer formed on the first copper alloy layer.
4. The display device of claim 1, wherein the data metal layer further comprises a copper layer formed on the first copper alloy layer and a second copper alloy layer formed on the copper layer.
5. The display device of claim 1, further comprising an etching-stopper disposed between the semiconductor pattern, the source electrode and the drain electrode and partially overlapped with the source electrode and the drain electrode.

6. The display device of claim 1, wherein an undercut of the semiconductor pattern is less than about 20 nm, the undercut of the semiconductor pattern defined as a length of a lower portion of the semiconductor pattern protruding from a lower surface of the semiconductor pattern in a lateral direction.

7. A method of manufacturing a display device, the method comprising:
   forming a gate pattern on a base substrate, the gate pattern including a gate line and a gate electrode;
   forming a semiconductor pattern and a source pattern by patterning both a data metal layer and an oxide semiconductor layer using a same etchant composition, wherein the data metal layer and the oxide semiconductor layer are formed on the base substrate having the gate pattern, the data metal layer including a first copper alloy layer, and the oxide semiconductor layer including an oxide semiconductor, wherein the source pattern includes a data line, a source electrode and a drain electrode; and
   forming a pixel electrode electrically connected to the drain electrode on the base substrate having the source pattern.

8. The method of claim 7, wherein the etchant composition comprises:
   about 0.1% to about 50% by weight of a persulfate;
   about 0.01% to about 5% by weight of an azole compound;
   about 0.05% to about 0.25% by weight of a fluoride compound; and
   about 45% to about 99.84% of a solvent.

9. The method of claim 7, wherein the etchant composition comprises:
   about 1% to about 10% by weight of a persulfate;
   about 0.1% to about 1% by weight of an azole compound;
   about 0.1% to about 0.2% by weight of a fluoride compound; and
   about 85% to about 99% of a solvent.

10. The method of claim 9, wherein the etchant composition further comprises about 0.01 to about 40 parts by weight of an additive including at least one selected from the group consisting of nitric acid, a salt of nitric acid, sulfuric acid, a salt of sulfuric acid, phosphoric acid, a salt of phosphoric acid, acetic acid and a salt of acetic acid, when the total weight of the etchant composition may be defined as 100 parts.

11. The method of claim 9, wherein the etchant composition further comprises about 0.001 to about 10 parts by weight of a sulfonic compound or about 0.0001 to about 5 parts by weight of a chelate agent, when the total weight of the etchant composition may be defined as 100 parts.

12. The method of claim 7, wherein the first copper alloy layer comprises copper and manganese.

13. The method of claim 12, wherein the data metal layer further comprises a copper layer formed on the first copper alloy layer.

14. The method of claim 12, wherein the data metal layer further comprises a copper layer formed on the first copper alloy layer and a second copper alloy layer formed on the copper layer.

15. The method of claim 7, further comprising forming an etching-stopper between the oxide semiconductor layer and the data metal layer, the etching-stopper being overlapped with at least a portion of the gate electrode.

16. The method of claim 15, wherein forming the source pattern comprises:
   forming a photoresist pattern on a source region and a drain region on the base substrate having the oxide semiconductor layer, the etching-stopper and the data metal layer to expose a channel region between the source region and the drain region; and
   etching the data metal layer and the oxide semiconductor layer by using the etchant composition and by using the photoresist pattern as an etching mask.

17. The method of claim 16, wherein the data metal layer and the oxide semiconductor layer are etched to form the data line, the source electrode, the drain electrode and the semiconductor pattern.

18. The method of claim 7, wherein forming the source pattern comprises:
   forming a photoresist pattern on the data metal layer, the photoresist pattern having a first portion on a source line region, a source region and a drain region and a second portion on a channel region between the source region and the drain region, the first portion being thicker than the second portion;
   etching the data metal layer and the oxide semiconductor layer by using the etchant composition and by using the photoresist pattern as an etching mask;
   removing the photoresist pattern on the channel region to expose the data metal layer on channel region; and
   removing the data metal layer on channel region to expose the semiconductor pattern on the channel region.

19. The method of claim 18, wherein the data metal layer and the oxide semiconductor layer are etched thereby forming the semiconductor pattern, the data line and an electrode pattern connected to the data line and formed on the source, drain and channel regions, and wherein the electrode pattern on the channel region is removed thereby forming the source electrode and the drain electrode when the semiconductor pattern on the channel region is exposed.

20. The method of claim 7, wherein an undercut of the semiconductor pattern is less than about 20 nm, the undercut of the semiconductor pattern defined as a length of a lower portion of the semiconductor pattern protruding from a lower surface of the semiconductor pattern in a lateral direction.

* * * * *